United States Patent
Sung et al.

(10) Patent No.: US 9,059,119 B2
(45) Date of Patent: Jun. 16, 2015

(54) DISPLAY APPARATUS

(71) Applicant: LG ELECTRONICS INC., Seoul (KR)

(72) Inventors: Jaehyun Sung, Seoul (KR); Dongwon Choi, Seoul (KR); Namhun Kim, Seoul (KR); Kitae Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 21 days.

(21) Appl. No.: 13/918,362

(22) Filed: Jun. 14, 2013

(65) Prior Publication Data

US 2014/0197380 A1    Jul. 17, 2014

(30) Foreign Application Priority Data

Jan. 15, 2013 (KR) .................. 10-2013-0004231
Jan. 15, 2013 (KR) .................. 10-2013-0004233

(51) Int. Cl.
*H01L 27/32* (2006.01)
*H01L 51/52* (2006.01)
*H01L 33/48* (2010.01)

(52) U.S. Cl.
CPC .......... *H01L 27/3241* (2013.01); *H01L 33/483* (2013.01); *H01L 51/524* (2013.01)

(58) Field of Classification Search
CPC ................................... H01L 51/524
See application file for complete search history.

(56) References Cited

U.S. PATENT DOCUMENTS

| 8,446,716 | B2 * | 5/2013 | Fan et al. | 361/679.21 |
| 2008/0180600 | A1 * | 7/2008 | Oh | 349/65 |
| 2011/0157519 | A1 * | 6/2011 | Yusa | 349/64 |
| 2011/0234079 | A1 * | 9/2011 | Eom et al. | 313/112 |
| 2013/0070399 | A1 * | 3/2013 | Liu et al. | 361/679.01 |

* cited by examiner

*Primary Examiner* — Stephen W Smoot
(74) *Attorney, Agent, or Firm* — Birch, Stewart, Kolasch & Birch, LLP

(57) ABSTRACT

A display device and a display apparatus including the same are disclosed. The display device includes a first substrate, a second substrate positioned opposite the first substrate, a seal member which attaches the first substrate to the second substrate and seals a display area positioned on the first substrate or the second substrate, and a plurality of pixels which are positioned in the display area and each include an organic light emitting layer. Each of the first and second substrates includes two first straight sides extending in a first direction, two second straight sides extending in a second direction crossing the first direction, and four edges where the two first straight sides and the two second straight sides intersect. The four edges of each of the first and second substrates are formed as curved edges.

13 Claims, 17 Drawing Sheets

DISPLAY APPARATUS

This application claims priority to and the benefit of Korean Patent Application No. 10-2013-0004231 and 10-2013-0004233 both filed in the Korean Intellectual Property Office on Jan. 15, 2013. The entire contents of all these applications are incorporated herein by reference.

BACKGROUND OF THE INVENTION

1. Field of the Invention

Embodiments of the invention relate to a display device and a display apparatus including the same.

2. Description of the Related Art

An organic light emitting device is manufactured by attaching and sealing a pair of substrates, which are positioned opposite each other with an organic light emitting member interposed therebetween, using a sealant. The sealant is disposed to surround the organic light emitting member along edges of the substrates.

The organic light emitting member included in the organic light emitting device includes a plurality of pixels. Each of the pixels includes red, green, and blue subpixels or may further include a white subpixel in addition to the red, green, and blue subpixels.

Each subpixel includes a hole injection electrode (or an anode), an electron injection electrode (or a cathode), and an organic light emitting layer formed between them.

Each subpixel emits light by energy generated when an exciton, which is produced by combining holes injected from the anode with electrons injected from the cathode in the organic light emitting layer, falls from an excitation level to a ground level. Therefore, the organic light emitting device is a self-emitting device not requiring a light source, unlike a liquid crystal display.

The organic light emitting device has excellent characteristics such as thin profile, lightness in weight, low power consumption, high luminance, and fast response time, and thus has been considered as a next generation display device in portable electric devices, televisions, etc.

SUMMARY OF THE INVENTION

In one aspect, there is a display device including a first substrate, a second substrate positioned opposite the first substrate, a seal member configured to attach the first substrate to the second substrate and seal a display area positioned on the first substrate or the second substrate, and a plurality of pixels positioned in the display area, each of the plurality of pixels including an organic light emitting layer.

Each of the first substrate and the second substrate includes two first straight sides extending in a first direction, two second straight sides extending in a second direction crossing the first direction, and four edges where the two first straight sides and the two second straight sides intersect. The four edges of each of the first substrate and the second substrate are formed as curved edges.

The display area includes a first pixel unit including m pixels arranged in the first direction and n pixels arranged in the second direction, where 'm' and 'n' are a positive integer equal to or greater than 3, and a second pixel unit including pixels, of which the number is less than 'm', arranged in the first direction and pixels, of which the number is less than 'n', arranged in the second direction. The second pixel unit is positioned in an area adjacent to a polygon edge.

Each of the curved edges may include a circle or an oval. A radius of curvature of the circle forming the curved edge may be about 5 mm to 35 mm.

The four edges of the first substrate may coincide with the four edges of the second substrate.

In another aspect, there is a display apparatus including a display device having the above-described configuration, a middle cabinet coupled with a front surface or a back surface of the display device, a back cover coupled to the back surface of the display device, and a rear cover coupled with the middle cabinet or the back cover. Portions of the middle cabinet and the rear cover covering edges of the display device include curved edges having the same shape and the same radius of curvature as the edges of the display device.

The back cover may be coupled with the rear cover using a fastening member, and the middle cabinet may be coupled with the rear cover using the fastening member.

For example, one of the back cover and the rear cover and one of the middle cabinet and the rear cover may include the fastening member. The fastening member may include a pair of latches which are coupled with each other. The latches may be positioned at the curved edge of the rear cover or may be positioned on a straight side existing in a start portion of the curved edge of the rear cover.

As another example, the fastening member may include a screw fixed to a middle line passing the middle of the curved edge of the rear cover.

As another example, the fastening member may include two or more screws fixed to a boundary between the curved edge and the straight side of the rear cover.

In yet another aspect, there is a display apparatus including a display device including a plurality of edges formed as curved edges and straight sides connecting the curved edges, a back cover coupled to a back surface of the display device, a rear cover coupled with the display device and the back cover, the rear cover having four edges formed as curved edges of the same shape as the curved edges of the display device, a lever member including a housing fixed to the back surface of the display device or a back surface of the back cover and a lever slidably installed inside the housing, and a sliding member including a guide positioned on a front surface of the rear cover and a sliding bar which is slidably installed on the guide, contacts the lever when the lever slides, and is used in the position movement.

Alternatively, the lever member may be positioned on the front surface of the rear cover, and the sliding member may be positioned on the back surface of the display device.

The housing is positioned at the curved edges of the display device, and the guide and the sliding bar are positioned on the front surface of the rear cover opposite the straight sides of the display device.

The housing includes a guide block forming a guide rail having a curved part and a cover coupled with the guide block. The lever of the lever member is coupled with the guide rail.

The lever includes a body coupled with the guide rail and a handle coupled with the body. The cover of the housing has a hole, to which the handle of the lever protrudes.

The handle protrudes to the outside of the housing through the hole at a sliding start position of the lever. The handle is entered into the housing and does not protrude to the outside of the housing through the hole at a sliding end position of the lever.

The guide block includes a protrusion capable of fixing and sliding the lever at the sliding start position and the sliding end position of the lever. The lever includes a groove, into which the protrusion is inserted.

The sliding bar slides along the guide by a sliding operation of the lever, and one end of the sliding bar is coupled with the housing when the lever is positioned at the sliding end position.

The display apparatus may further include a middle cabinet covering the straight sides in the side of the display device and an auxiliary middle cabinet covering the curved edges of the display device. The auxiliary middle cabinet may cover the curved edges of the display device in a state where the lever is positioned at the sliding end position.

The auxiliary middle cabinet may include curved edges having the same shape and the same radius of curvature as the curved edge of the display device. Each of the middle cabinet and the auxiliary middle cabinet may include a bezel covering the edges of the display device.

According to the above-described characteristics, because the edges of the display device are formed as the curved edges, even if an impact is applied to the edges of the display device from the outside, the first and second substrates of the display device may be prevented from being separated due to a damage of a sealing member for attaching and sealing the first and second substrates of the display device. Hence, an impact resistance of the display device is improved.

Further, when the edges of the display device are formed as the straight edges, a bezel width of a component (for example, the middle cabinet, the rear cover, or the auxiliary middle cabinet) covering the edges of the display device has to increase, so as to form an outer edge of the component covering the edges of the display device as a curved edge. However, when the edges of the display device are formed as the curved edges in the same manner as the middle cabinet, the rear cover, or the auxiliary middle cabinet, the bezel width of the component may be minimized. Hence, an appearance of the display apparatus is improved.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
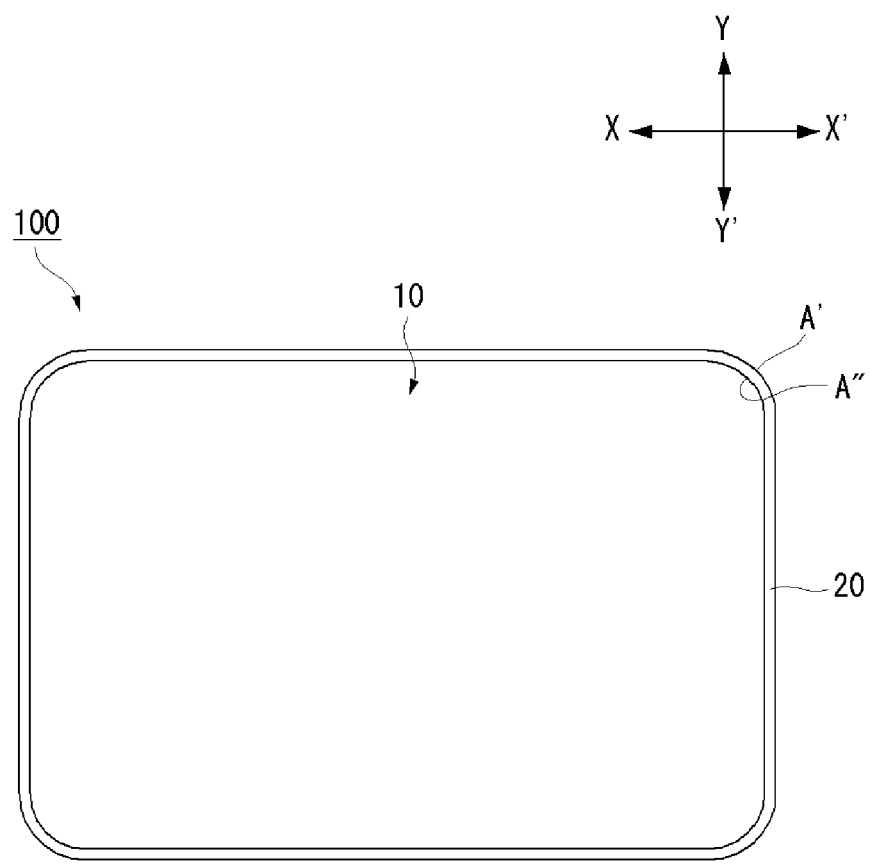
FIG. 1 is a front view of a display apparatus according to a first embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components.

For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or" being linked to" another component, this should be understood to mean that still another component(s) may exist between them, although the arbitrary component may be directly connected to, or linked to, the second component.

In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains.

The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Example embodiments of the invention are described with reference to FIGS. 1 to 18.

Figure 2:
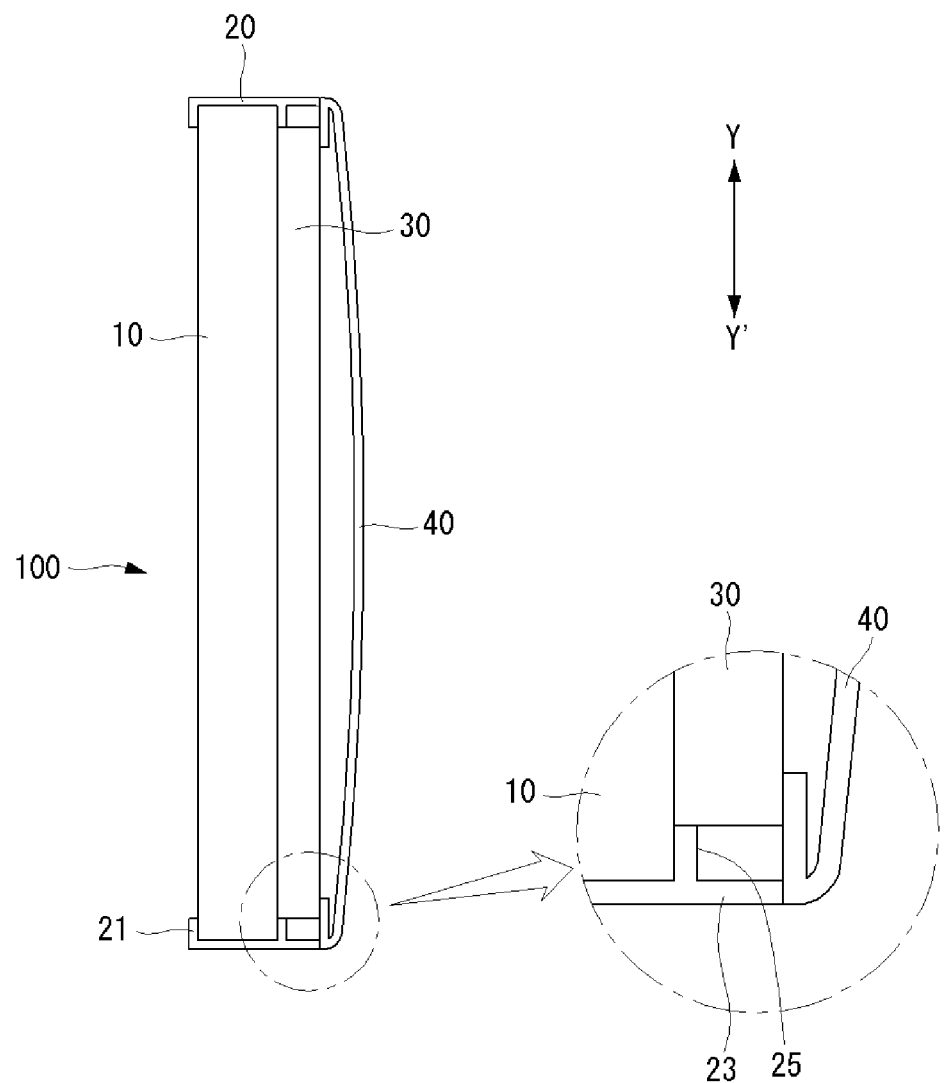
FIG. 2 is a cross-sectional view of FIG. 1 in a second direction.
Figure 3:
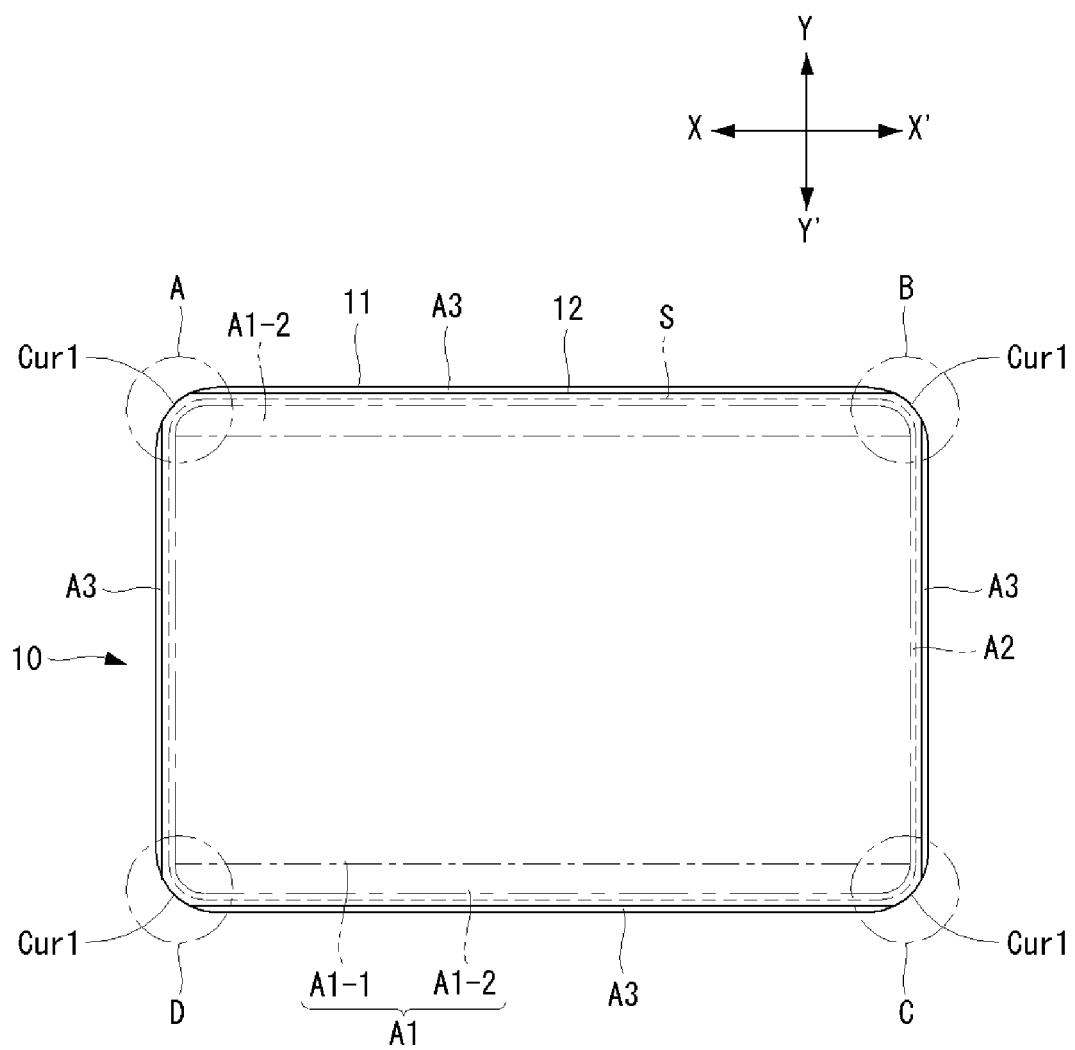
FIG. 3 is a front view of a display device shown in FIG. 1.
Figure 4:
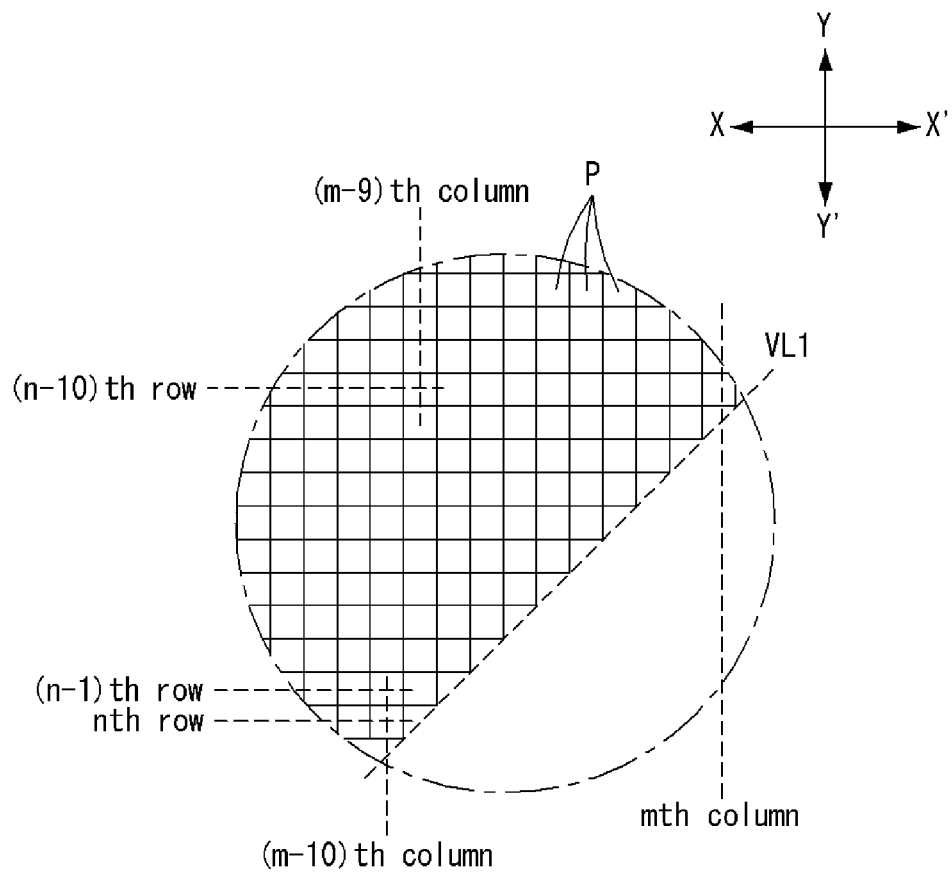
FIG. 4 is a conceptual diagram showing configuration of a second pixel unit of a display device shown in FIG. 3.

FIG. 1 is a front view of a display apparatus according to a first embodiment of the invention. FIG. 2 is a cross-sectional view of FIG. 1 in a second direction. FIG. 3 is a front view of a display device shown in FIG. 1. FIG. 4 is a conceptual diagram showing configuration of a second pixel unit of a display device shown in FIG. 3.

As shown in FIGS. 1 to 4, a display apparatus 100 according to an embodiment of the invention includes a display device 10, a middle cabinet 20 coupled with the display device 10, a back cover 30 coupled to a back surface of the display device 10, and a rear cover 40 coupled with the back cover 30.

The display device 10 may be an organic light emitting device. Other kinds of display devices may be used.

The display device 10 includes a first substrate 11 and a second substrate 12 opposite the first substrate 11.

At least one of the first substrate 11 and the second substrate 12 may be a flexible substrate. Alternatively, both the first substrate 11 and the second substrate 12 may be glass substrates.

The flexible substrate may include a polymer resin and a fiber texture positioned inside the polymer resin. The fiber texture may be formed of an optical fiber or a yarn or a fabric using the optical fiber. The polymer resin may include an epoxy resin, an acrylic resin, etc.

The first substrate 11 and the second substrate 12 include a display area A1, in which a plurality of pixels are positioned and display an image, and a periphery area A2 surrounding the display area A1.

A sealant 'S' is formed between the first substrate 11 and the second substrate 12 around the display area A1 to attach and fix the first substrate 11 to the second substrate 12. The sealant 'S' may be referred to as a seal or a sealing member and seals the display area A1.

When the first substrate 11 and the second substrate 12 are attached, the first substrate 11 may include a pad area A3 which is not covered by the second substrate 12 and is exposed. A pad part may be positioned in the pad area A3 to connect signal lines, such as scan lines and data lines, to a driver.

A driver supplying a scan signal to the scan lines may be positioned in left and right pad areas positioned on the left and right sides of the display area A1. A driver supplying a data signal to the data lines may be positioned in a lower pad area positioned on the lower side of the display area A1.

Each of the first and second substrates 11 and 12 of the display device 10 according to the embodiment of the invention includes two first sides extending in a first direction X-X', two second sides extending in a second direction Y-Y' crossing the first direction X-X', and four edges A, B, C, and D where the two first sides and the two second sides intersect.

All of the four edges A, B, C, and D of each of the first and second substrates 11 and 12 are formed as curved edges Cur1.

For example, as shown in FIG. 3, the edge 'A' positioned on the upper left side of each of the first and second substrates 11 and 12 is an edge where the upper side and the left side of the display area A1 intersect. The edge 'A' may be formed as a curved edge Cur1. The shape of the curved edge Cur1 may be a circle, an oval, a parabola, etc.

The curved edges Cur1 of the four edges A, B, C, and D of each of the first and second substrates 11 and 12 are described below with reference to FIGS. 5 and 6.

Figure 5:
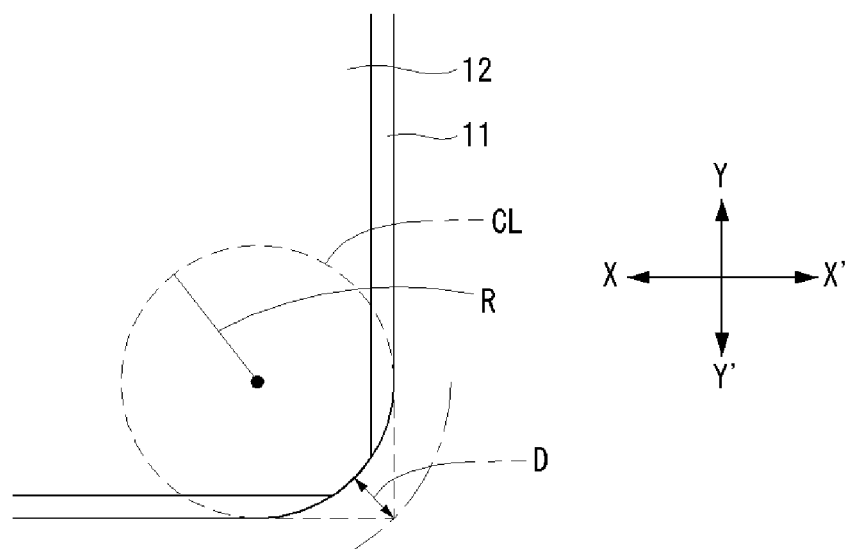
FIG. 5 is a front view of an edge of a display device according to an example embodiment of the invention.

As shown in FIG. 5, the curved edges Cur1 of the edges A, B, C, and D may be a portion of a circle CL. A radius R of curvature of the circle CL may be about 5 mm to 35 mm. In this instance, the sealant 'S' may be prevented from being broken by an impact applied to the edges A, B, C, and D, and thus the first and second substrates 11 and 12 may be efficiently prevented from being separated from each other. Further, a width of a bezel may be reduced.

In particular, an impact resistance of the display device 10 obtained when the radius R of curvature of the circle CL is equal to or greater than about 5 mm may be greater than an impact resistance of the display device 10 obtained when the radius R of curvature of the circle CL is less than about 5 mm.

More specifically, the present inventor conducted an experiment to collide the curved edge Cur1 of the display device 10 with a collision surface and measure a collision distance. According to the experiment, when the radius R of curvature of the circle CL was equal to or greater than about 5 mm, the sealant 'S' was prevented from being broken even if an external impact was applied to the curved edge Cur1.

In the embodiment of the invention, the collision distance may a separation distance between the first and second substrates 11 and 12 when a crack or a peeling is generated in the first substrate 11 or the second substrate 12 of the display device 10 in the collision process or the sealant 'S' is broken in the collision process.

In the collision experiment, an angle between one side of the display device 10 and the collision surface was set to about 45°, and an angle between an inclined surface, on which the display device 10 was placed, and the ground was set to about 30°.

Further, when the radius R of curvature of the circle CL was equal to or greater than about 35 mm, the width of the bezel excessively increased.

In other words, as shown in FIG. 5, when a display device having the same size as the embodiment of the invention has four rectangular edges, a bezel having a large width has to be formed so as to form edges of component surrounding borders of the display device as curved edges, as indicated by alternated long and short dash line.

Accordingly, when the display device having the same size as the embodiment of the invention has the rectangular edges, the bezel width of the display device having the rectangular edges was greater than the display device according to the embodiment of the invention by a predetermined width 'D'. Hence, aesthetic quality of the display apparatus was reduced, and the size of the display area of the display device was not satisfactory.

On the other hand, when the edges A, B, C, and D of the display device 10 are the curved edges Cur1 having the radius R of curvature less than about 35 mm, the bezel width may be minimized. Further, an inner edge and an outer edge of the component surrounding the borders of the display device 10 may be formed as curved edges having the same shape as the edges A, B, C, and D of the display device 10.

Accordingly, it is preferable, but not required, that the radius R of curvature of the circle CL forming the curved edge Cur1 may be about 5 mm to 35 mm.

Figure 6:
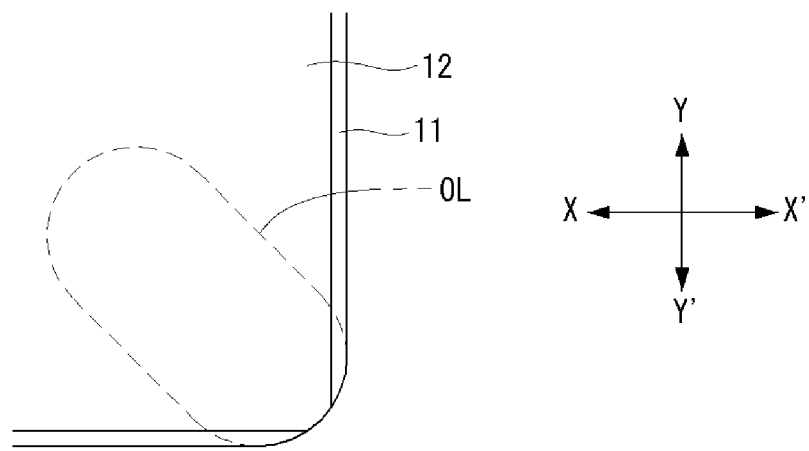
FIG. 6 is a front view of an edge of a display device according to another example embodiment of the invention.

Alternatively, as shown in FIG. 6, the curved edge Cur1 may be a portion of an oval OL.

As shown in FIGS. 3, 5, and 6, the four edges of the first substrate 11 may coincide with the four edges of the second substrate 12.

In the embodiment of the invention, the fact that the four edges of the first substrate 11 coincide with the four edges of the second substrate 12 is that there is no space between the edge of the first substrate 11 and the edge of the second substrate 12.

The display area A1 of the display device 10 includes one first pixel unit A1-1 and two second pixel units A1-2.

The first pixel unit A1-1 includes m pixels P arranged in the first direction X-X' and n pixels P arranged in the second direction Y-Y', where 'm' and 'n' are a positive integer equal to or greater than 3.

Each of the two second pixel units A1-2 includes pixels P, of which the number is less than 'm', arranged in the first direction X-X' and pixels P, of which the number is less than 'n', arranged in the second direction Y-Y'. The second pixel units A1-2 are positioned adjacent to the curved edges Cur1 of the first and second substrates 11 and 12.

More specifically, as shown in FIG. 3, the first pixel unit A1-1 is positioned in the center of the display area A1 of the display device 10, and the two second pixel units A1-2 are respectively positioned on the upper and lower sides of the first pixel unit A1-1.

The embodiment of the invention will be described on the assumption that the two second pixel units A1-2 are respectively positioned on the upper and lower sides of the first pixel unit A1-1. However, the two second pixel units A1-2 may be respectively positioned on the left and right sides of the first pixel unit A1-1.

As shown in FIG. 4, the second pixel unit A1-2 includes pixels P, of which the number is less than 'n', arranged in the first direction X-X' and pixels P, of which the number is less than 'm', arranged in the second direction Y-Y'.

For example, supposing that each of 'm' and 'n' is a positive integer equal to or greater than 100, in an nth column of the second pixel unit A1-2 positioned on the lower right side of the first pixel unit A1-1, the pixels are arranged on first to (m-10)th rows, but are not arranged on (m-9)th to mth rows.

Further, in an (n-1)th column of the second pixel unit A1-2, the pixels are arranged on the first to (m-9)th rows, but are not arranged on the (m-8)th to mth rows.

Similar to this, as the second pixel unit A1-2 goes from the nth to (n-10)th columns toward the first pixel unit A1-1, the number of pixels disposed on each column increases by one.

According to the above-described pixel arrangement structure, a virtual line VL1 connecting the pixels arranged at an outermost edge of the second pixel unit A1-2 has a shape almost similar to the curved edge Cur1 of the display device 10.

So far, the embodiment of the invention described the pixel arrangement structure of the second pixel unit A1-2 positioned on the lower right side of the display device 10. However, the pixel arrangement structure of the second pixel unit A1-2 positioned on the lower left side of the display device 10 has the same pattern as the pixel arrangement structure of the second pixel unit A1-2 positioned on the lower right side of the display device 10.

Accordingly, as the second pixel units A1-2 positioned on the lower left and right sides of the first pixel unit A1-1 go from the nth to (n-10)th columns toward the first pixel unit A1-1, the number of pixels disposed on each column increases by two.

Because the second pixel unit A1-2 positioned in the display area A1 has the above-described pixel arrangement structure in an area adjacent to the curved edge Cur1 of the display device 10, the sealant 'S' for sealing the display area A1 has a shape almost similar to a plane shape of the display area A1.

In other words, the four edges of the sealant 'S' may have a shape almost similar to the curved edge Cur1 of the display device 10.

Each of the pixels included in the first pixel unit A1-1 and the second pixel unit A1-2 includes red, green, and blue subpixels or may further include a white subpixel in addition to the red, green, and blue subpixels.

Alternatively, each pixel may include only a white subpixel, and light generated in the white subpixel may pass through red, green, and blue color filters, thereby displaying an image.

The structure of the pixel, more specifically, the subpixel of the display device is described below with reference to FIGS. 7 and 8.

Figure 7:
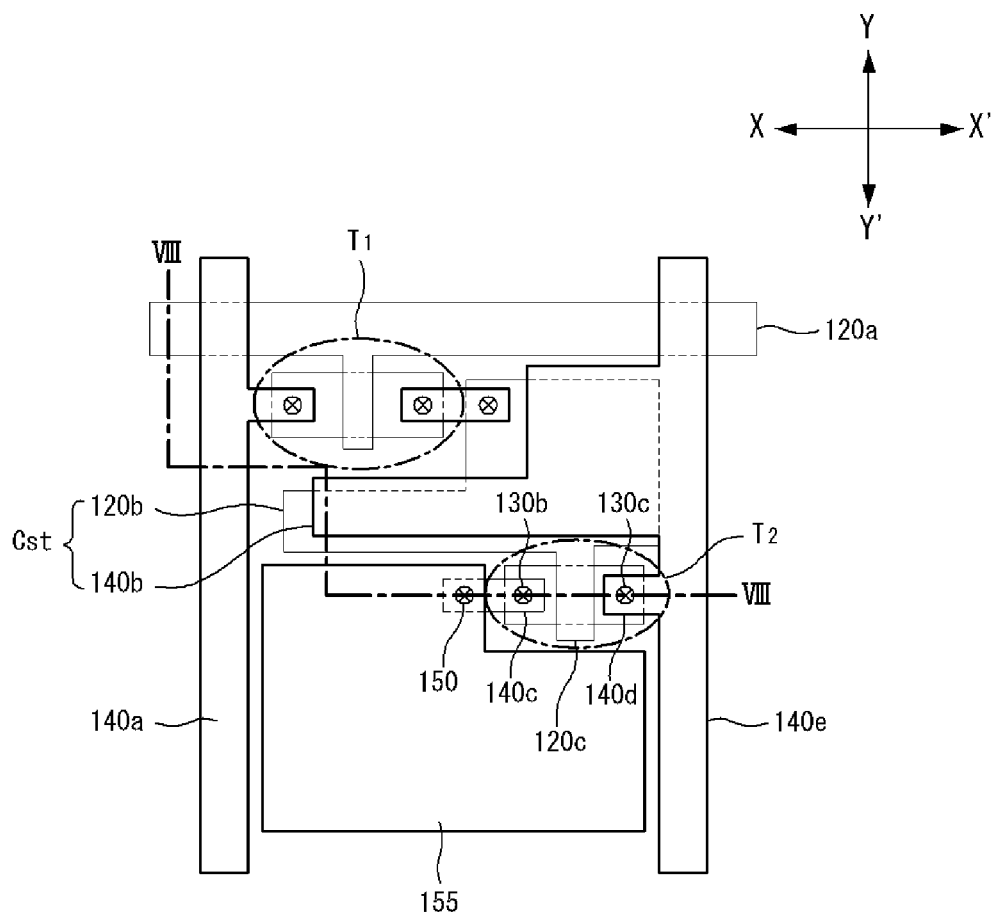
FIG. 7 is a front view showing a structure of a subpixel of a display device.

FIG. 7 is a front view showing a structure of a subpixel of the display device. FIG. 8 is a partial cross-sectional view taken along line VIII-VIII of FIG. 7.

Figure 8:
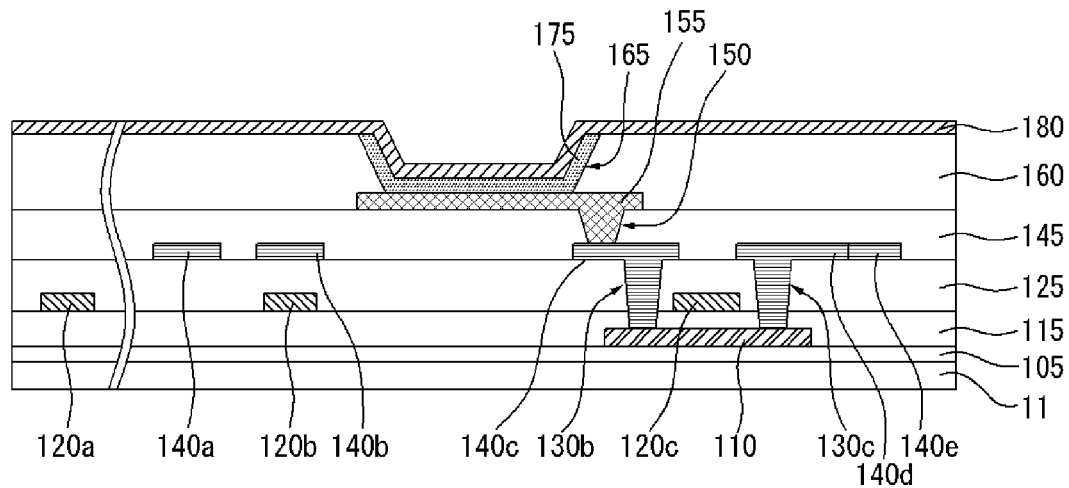
FIG. 8 is a partial cross-sectional view taken along line VIII-VIII of FIG. 7.

As shown in FIGS. 7 and 8, each subpixel may include a scan line 120a arranged in the first direction X-X', a data line 140a arranged in the second direction Y-Y' crossing the scan line 120a, a power supply line 140e arranged parallel to the data line 140a, a switching thin film transistor T1 connected to the scan line 120a and the data line 140a in an area formed by the lines 120a, 140a, and 140e, a capacitor Cst connected to the switching thin film transistor T1 and the power supply line 140e, and a driving thin film transistor T2 connected to the capacitor Cst and the power supply line 140e.

The capacitor Cst may include a capacitor lower electrode 120b and a capacitor upper electrode 140b.

The subpixel may further include a first electrode 155 electrically connected to the driving thin film transistor T2, an organic light emitting layer 175 positioned on the first electrode 155, and a second electrode 180 positioned on the organic light emitting layer 175.

A buffer layer 105 is positioned on the first substrate 11 or the second substrate 12, so as to form the subpixel having the above-described structure.

The buffer layer 105 is formed so as to protect a thin film transistor, which will be formed in a subsequent process, from impurities, for example, alkali ions coming from the first substrate 11 or the second substrate 12. The buffer layer 105 may be selectively formed using silicon dioxide ($SiO_2$), silicon nitride (SiNx), etc.

A semiconductor layer 110 is positioned on the buffer layer 105. The semiconductor layer 110 may contain amorphous silicon or crystallized polycrystalline silicon.

The semiconductor layer 110 may include a source region and a drain region, each of which contains p-type impurities or n-type impurities. The semiconductor layer 110 may further include a channel region in addition to the source region and the drain region.

A first insulating layer 115, which may be a gate insulating layer, is positioned on the semiconductor layer 110. The first insulating layer 115 may be a silicon oxide (SiOx) layer, a silicon nitride (SiNx) layer, or multiple layers thereof.

A gate electrode 120c is positioned on the first insulating layer 115 in a predetermined region of the semiconductor layer 110 (i.e., at a position corresponding to the channel region when impurities are injected). The scan line 120a and the capacitor lower electrode 120b are positioned at the same level layer as the gate electrode 120c.

The gate electrode 120c and the scan line 120a may be formed of one selected from the group consisting of molybdenum (Mo), aluminum (Al), chrome (Cr), gold (Au), titanium (Ti), nickel (Ni), neodymium (Nd), tantalum (Ta), tungsten (W), and copper (Cu) or a combination thereof. Other materials may be used.

A second insulating layer 125 serving as an interlayer dielectric layer is positioned on the scan line 120a, the capacitor lower electrode 120b, and the gate electrode 120c. The second insulating layer 125 may be a silicon oxide (SiOx) layer, a silicon nitride (SiNx) layer, or multiple layers thereof.

Contact holes 130b and 130c are positioned in the second insulating layer 125 and the first insulating layer 115 to expose a portion of the semiconductor layer 110. A drain electrode 140c and a source electrode 140d are positioned on the second insulating layer 125 and are electrically connected to the semiconductor layer 110 through the contact holes 130b and 130c.

The drain electrode 140c and the source electrode 140d may be formed of one selected from the group consisting of molybdenum (Mo), aluminum (Al), chrome (Cr), gold (Au), titanium (Ti), nickel (Ni), neodymium (Nd), and copper (Cu) or a combination thereof. Other materials may be used.

The data line 140a, the capacitor upper electrode 140b, and the power supply line 140e are positioned at the same level layer as the drain electrode 140c and the source electrode 140d.

The data line 140a and the power supply line 140e may have a single-layered structure or a multi-layered structure. The data line 140a and the power supply line 140e may be formed of one selected from the group consisting of molybdenum (Mo), aluminum (Al), chrome (Cr), gold (Au), titanium (Ti), nickel (Ni), neodymium (Nd), and copper (Cu) or a combination thereof. Other materials may be used.

A third insulating layer 145 is positioned on the data line 140a, the capacitor upper electrode 140b, the drain electrode 140c, the source electrode 140d, and the power supply line 140e. The third insulating layer 145 may serve as a planarization layer so as to relieve a height difference of the lower structure. The third insulating layer 145 may be formed of an inorganic material such as spin-on-glass (SOG) formed by coating an organic material, such as polyimide, benzocyclobutene (BCB)-based resin, and acrylate, or silicon oxide in a liquid state and then hardening it. Other materials may be used.

Alternatively, the third insulating layer 145 may serve as a passivation layer and may be a silicon oxide (SiOx) layer, a silicon nitride (SiNx) layer, or multiple layers thereof.

A via hole 150 is positioned in the third insulating layer 145 to expose one of the drain electrode 140c and the source electrode 140d. The first electrode 155 is positioned on the third insulating layer 145 and is electrically connected to one of the drain electrode 140c and the source electrode 140d through the via hole 150.

The first electrode 155 may be an anode and may be a transparent electrode or a reflection electrode. When the display device 11 according to the embodiment of the invention has a bottom emission structure or a dual emission structure, the first electrode 155 may be the transparent electrode and may be formed of one of indium tin oxide (ITO), indium zinc oxide (IZO), and zinc oxide (ZnO).

Alternatively, when the display device 11 according to the embodiment of the invention has a top emission structure, the first electrode 155 may be the reflection electrode. In this instance, the first electrode 155 may further include a reflection layer formed of one of aluminum (Al), silver (Ag), and nickel (Ni) under a layer formed of one of ITO, IZO and ZnO, or may further include a reflection layer between two layers formed of one of ITO, IZO and ZnO.

A fourth insulating layer 160 is positioned on the third insulating layer 145 and includes an opening 165 which insulates the adjacent first electrodes 155 and exposes a portion of the first electrode 155. The fourth insulating layer 160 may be a bank layer or a pixel defining layer.

The organic light emitting layer 175 is positioned on the first electrode 155 exposed by the opening 165.

The organic light emitting layer 175 may include an electron injection layer, an electron transport layer, a light emitting layer, a hole transport layer, and a hole injection layer.

At least one of the layers constituting the organic light emitting layer 175 may further contain an inorganic material, and the inorganic material may further contain a metal compound.

The metal compound may include alkali metal or alkaline earth metal. The metal compound including the alkali metal or the alkaline earth metal may include one selected from the group consisting of LiF, NaF, KF, RbF, CsF, FrF, $BeF_2$, $MgF_2$, $CaF_2$, $SrF_2$, $BaF_2$, and $RaF_2$, but is not limited thereto.

The light emitting layer may be formed of a material capable of producing red, green, blue and white light, for example, a phosphorescence material or a fluorescence material. Alternatively, the light emitting layer may be formed of a material capable of producing only white light. In this instance, an image may be displayed using a color filter.

The second electrode 180 is positioned on the organic light emitting layer 175. The second electrode 180 may be a cathode and may be formed of magnesium (Mg), calcium (Ca), aluminum (Al), silver (Ag), or a combination thereof, each of which has a low work function.

When the display device 11 according to the embodiment of the invention has the top emission structure or the dual emission structure, the second electrode 180 may be thin enough to transmit light. Alternatively, when the display device 11 according to the embodiment of the invention has the bottom emission structure, the second electrode 180 may be thick enough to reflect light.

A connection structure of the display apparatus 100 of FIG. 1 including the display device 11 having the above-described configuration is described below with reference to FIGS. 2, 9, and 10A to 10C.

As shown in FIG. 2, the display apparatus 100 according to the first embodiment of the invention includes the display device 10 having the edges A, B, C, and D formed as the curved edges Cur1, the middle cabinet 20 coupled with the display device 10, the back cover 30 coupled to the back surface of the display device 10, and the rear cover 40 coupled with the back cover 30.

The back cover 30 is attached to the back surface of the display device 10 using an adhesive. A circuit board (not shown) may be disposed on a back surface of the back cover 30.

The back cover 30 may dissipate heat generated in the display device 10.

When the size of the back cover 30 is substantially equal to the size of the display device 10, four edges of the back cover 30 may be formed as curved edges of the same shape as the edges A, B, C, and D of the display device 10. Alternatively, when the size of the back cover 30 is less than the size of the display device 10, the four edges of the back cover 30 may be formed as rectangular edges.

The rear cover 40 may have curved edges of the same shape as the edges A, B, C, and D of the display device 10 in the same manner as the back cover 30.

In the embodiment of the invention, the middle cabinet 20 attached to the display device 10 may include a bezel 21 covering the periphery area A2 and the pad area A3 of the display device 10, a side cover 23 covering the side of the display device 10, and a leg 25 protruding from a middle portion of the side cover 23 to the inside of the display device 10. The leg 25 may be omitted in the embodiment of the invention.

The middle cabinet 20 may be attached to the display device 10 using a double-sided tape.

As shown in FIG. 1, the bezel 21 of the middle cabinet 20 has an outer edge A' and an inner edge A", each of which is formed as curved edge Cur1 of the same shape as the edges A, B, C, and D of the display device 10.

On the other hand, when the periphery area A2 and the pad area A3 of the display device 10 have the very narrow width, the middle cabinet 20 may not include the bezel 21.

According to the above structure of the middle cabinet 20, the display device 10 may be positioned in a space between the bezel 21 and the leg 25.

At least one pair of latches 51, which are coupled with each other, are formed on the back surface of the back cover 30 and a front surface of the rear cover 40, so as to couple a couple structure with the rear cover 40 in a state where the display device 10, the middle cabinet 20, and the back cover 30 are coupled.

In the embodiment of the invention, "the front surface" is the surface facing toward the display device 10, and "the back surface" is the surface opposite the front surface.

Figure 9:
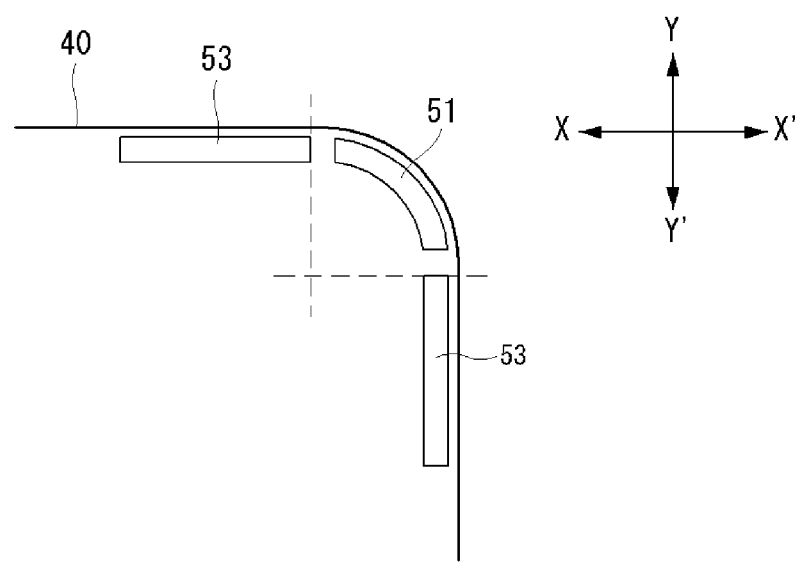
FIG. 9 is a conceptual diagram illustrating a formation position of a latch.

FIG. 9 is a conceptual diagram illustrating a formation position of the latch 51. More specifically, FIG. 9 shows that the latch 51 is formed on the rear cover 40. However, although not shown, it is a matter of course that the latch 51 is formed on the back surface of the back cover 30, i.e., at a location corresponding to the rear cover 40 on which the latch 51 is formed.

Namely, the latch 51 formed on the rear cover 40 and the latch 51 formed on the back surface of the back cover 30 form a pair.

Since a shape and a structure of the latch 51 are well known to those skilled in the art, a description thereof may be briefly made or may be entirely omitted. In the embodiment of the invention, only the formation position of the latch 51 is described.

When the outer edge A' and the inner edge A" of the bezel 21 are formed as curved edges Cur1 of the same shape as the edges A, B, C, and D of the display device 10, a possibility of a crack between the middle cabinet 20 and the rear cover 40 or between the back cover 30 and the rear cover 40 in the outer edge A' greatly increases, compared to when the outer edge A' of the bezel 21 is formed as the rectangular edge.

Accordingly, when the outer edge A' and the inner edge A" of the bezel 21 are formed as the curved edges Cur1 of the same shape as the edges A, B, C, and D of the display device 10, the latch 51 is formed at a curved edge Cur1 of the rear cover 40. Further, it is preferable, but not required, that a guide 53 is formed at a rectangular edge (adjacent to the curved edge Cur1 of the rear cover 40) of the rear cover 40.

The guide 53 has a bar shape protruding to the back surface of the back cover 30. A groove (not shown) is formed in the back surface of the back cover 30, and thus the guide 53 is inserted into the groove.

Accordingly, the guide 53 positioned on the front surface of the rear cover 40 is inserted into the groove (not shown) formed in the back surface of the back cover 30, and also the latch 51 positioned on the front surface of the rear cover 40 and the latch (not shown) positioned on the back surface of the back cover 30 achieve pair-bonding. Hence, the assembly of the display apparatus 100 is completed.

Alternatively, the latch 51 may be formed at the rectangular edge (adjacent to the curved edge Cur1 of the rear cover 40) of the rear cover 40, and also the guide 53 may be formed at the curved edge Cur1 of the rear cover 40. In other words, the guide 53 may be formed in the formation area of the latch 51 shown in FIG. 9, and the latch 51 may be formed in the formation area of the guide 53 shown in FIG. 9.

The display apparatus 100 assembled by the above-described coupling structure using the latches 51 and the guide 53 may use a unibody structure and also is able to perform the after treatment of inner components of the display apparatus 100 in a process for releasing the coupling of the latches 51.

Unlike the above description, the middle cabinet 20 and the back cover 30 may be coupled with the back surface of the display device 10, and the rear cover 40 may be coupled with the middle cabinet 20.

In this instance, the middle cabinet 20 may not include the bezel 21 covering the periphery area A2 and the pad area A3 of the display device 10, and the side cover 23 covering the side of the display device 10 may be formed as a curved edge of the same shape as the edges A, B, C, and D of the display device 10.

The latches and groove positioned in the back surface of the back cover 30 may be formed in a back surface of the leg 25 of the middle cabinet 20.

So far, the embodiment of the invention described the coupling structure using the latches, but may use the coupling structure using a screw.

The coupling structure using a screw is described below with reference to FIGS. 10A to 10C.

Figure 10A:
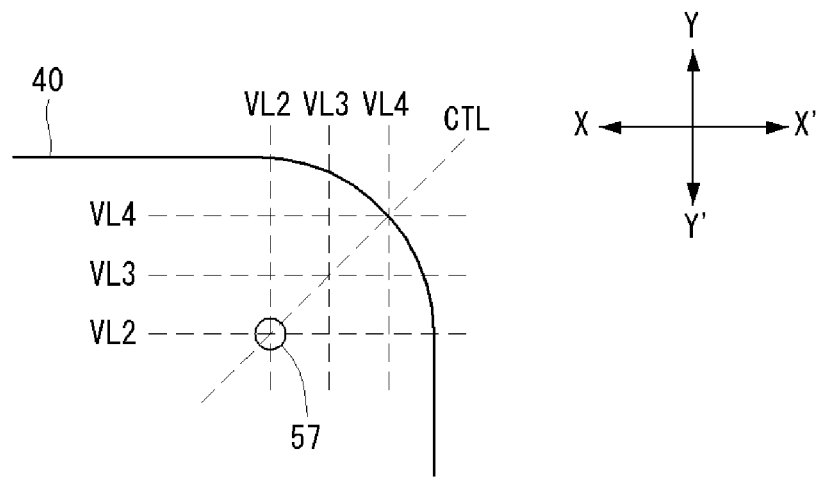
FIGS. 10A to 10C are conceptual diagrams illustrating a fixation position of a screw.
Figure 10B:
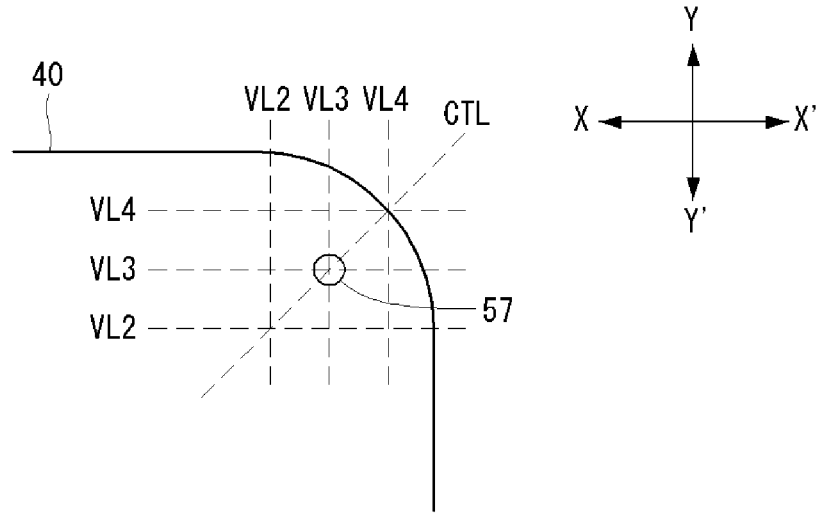
Figure 10C:
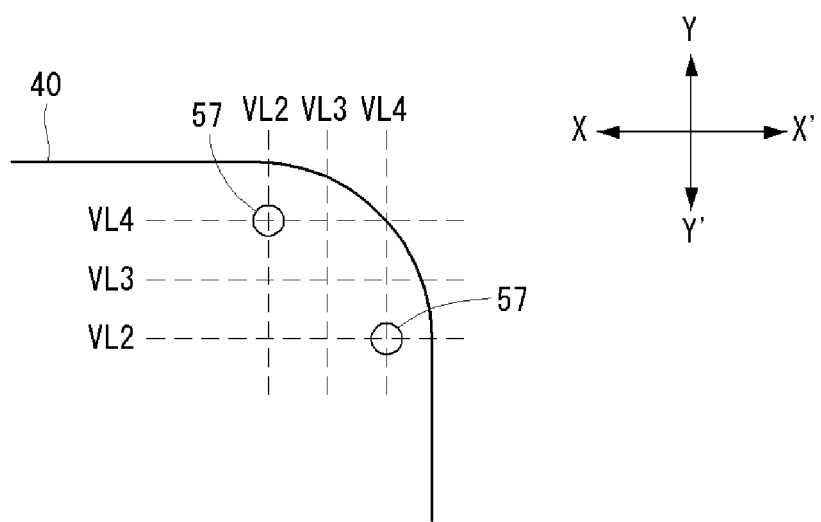

As shown in FIGS. 10A and 10B, when the rear cover 40 is coupled with the middle cabinet 20 using a screw in a state where the middle cabinet 20 and the back cover 30 are coupled with the back surface of the display device 10, it is preferable, but not required, that a screw 57 is fixed on a middle line CTL passing the middle of a curved edge Cur1 of the rear cover 40, so as to efficiently prevent a crack from being generated between the middle cabinet 20 and the rear cover 40.

More specifically, as shown in FIG. 10A, when the curved edge Cur1 of the rear cover 40 is divided into three virtual lines VL2, VL3, and VL4 along the first direction X-X' and the second direction Y-Y', the screw 57 may be fixed at a position where the lowermost line VL2 among the three virtual lines VL2, VL3, and VL4 divided in the first direction X-X' and the leftmost line VL2 among the three virtual lines VL2, VL3, and VL4 divided in the second direction Y-Y' intersect.

Alternatively, as shown in FIG. 10B, the screw 57 may be fixed at a position where the middle line VL3 among the three virtual lines VL2, VL3, and VL4 divided in the first direction X-X' and the middle line VL3 among the three virtual lines VL2, VL3, and VL4 divided in the second direction Y-Y' intersect.

When the two screws 57 are used, the curved edge Cur1 of the rear cover 40 is divided into three virtual lines VL2, VL3, and VL4 along the first direction X-X' and the second direction Y-Y'. It is preferable, but not required, that the two screws 57 are respectively fixed at a position where the uppermost line VL4 among the three virtual lines VL2, VL3, and VL4 divided in the first direction X-X' and the leftmost line VL2 among the three virtual lines VL2, VL3, and VL4 divided in the second direction Y-Y' intersect, and at a position where the lowermost line VL2 among the three virtual lines VL2, VL3, and VL4 divided in the first direction X-X' and the rightmost line VL4 among the three virtual lines VL2, VL3, and VL4 divided in the second direction Y-Y' intersect.

Although not shown, the screw 57 may be fixed from the back surface of the rear cover 40, and a boss may be formed at the back surface of the leg 25 of the middle cabinet 20, to which the screw 57 is fixed.

A display apparatus according to a second embodiment of the invention is described below.

Figure 11:
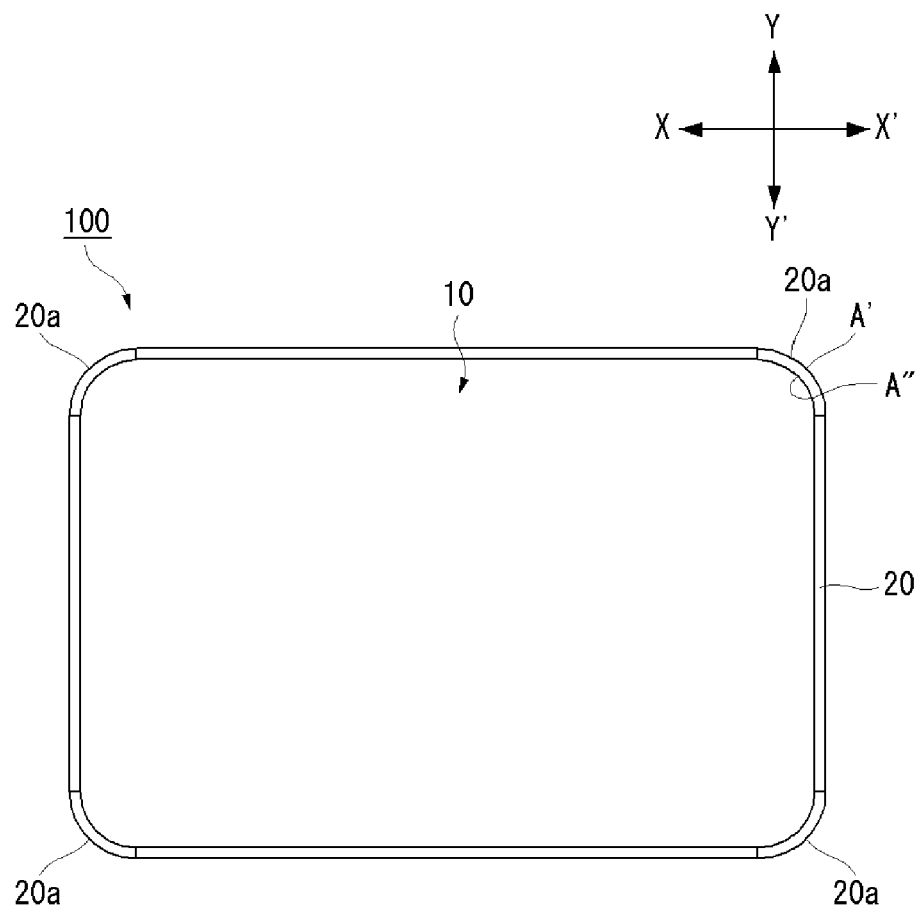
FIG. 11 is a front view of a display apparatus according to a second embodiment of the invention.
Figure 12:
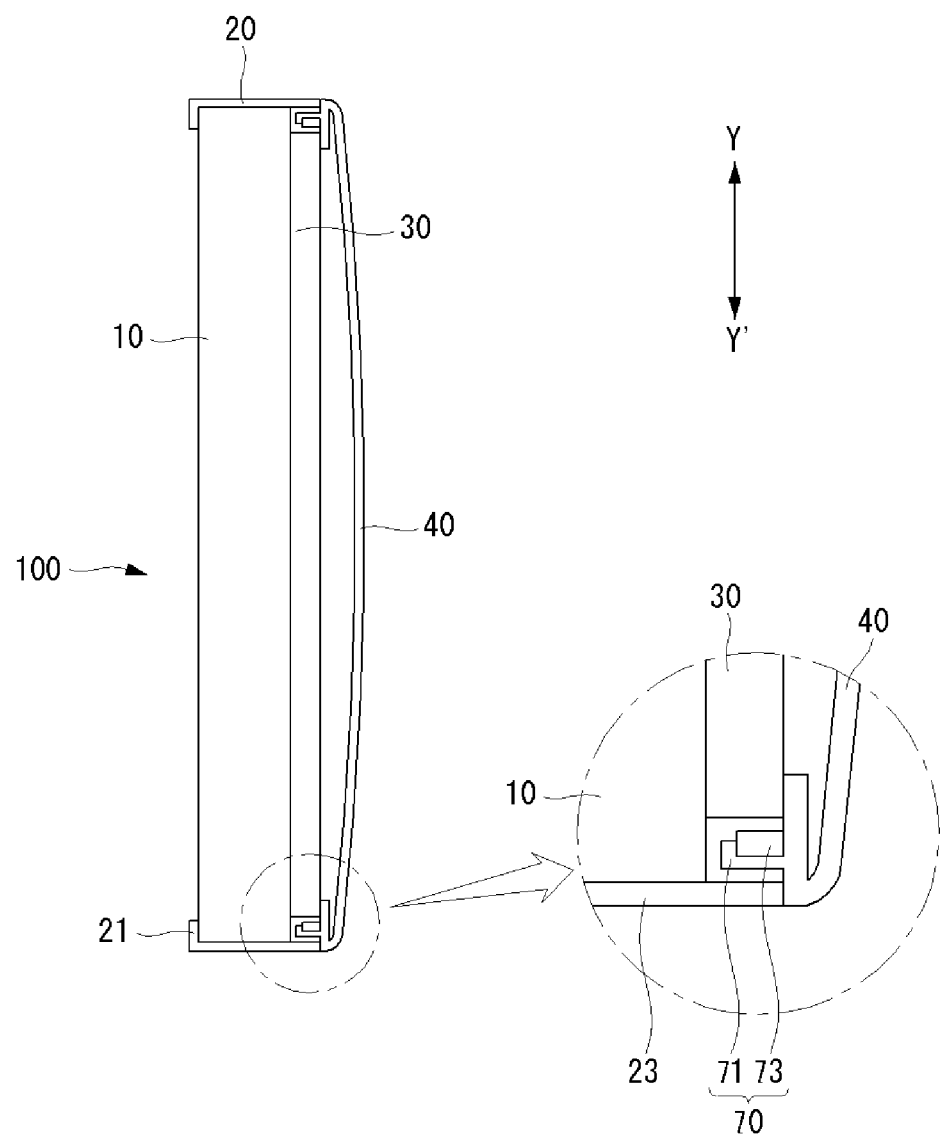
FIG. 12 is a cross-sectional view of FIG. 11 in a second direction.

FIG. 11 is a front view of a display apparatus according to a second embodiment of the invention. FIG. 12 is a cross-sectional view of FIG. 11 in a second direction.

Figure 13:
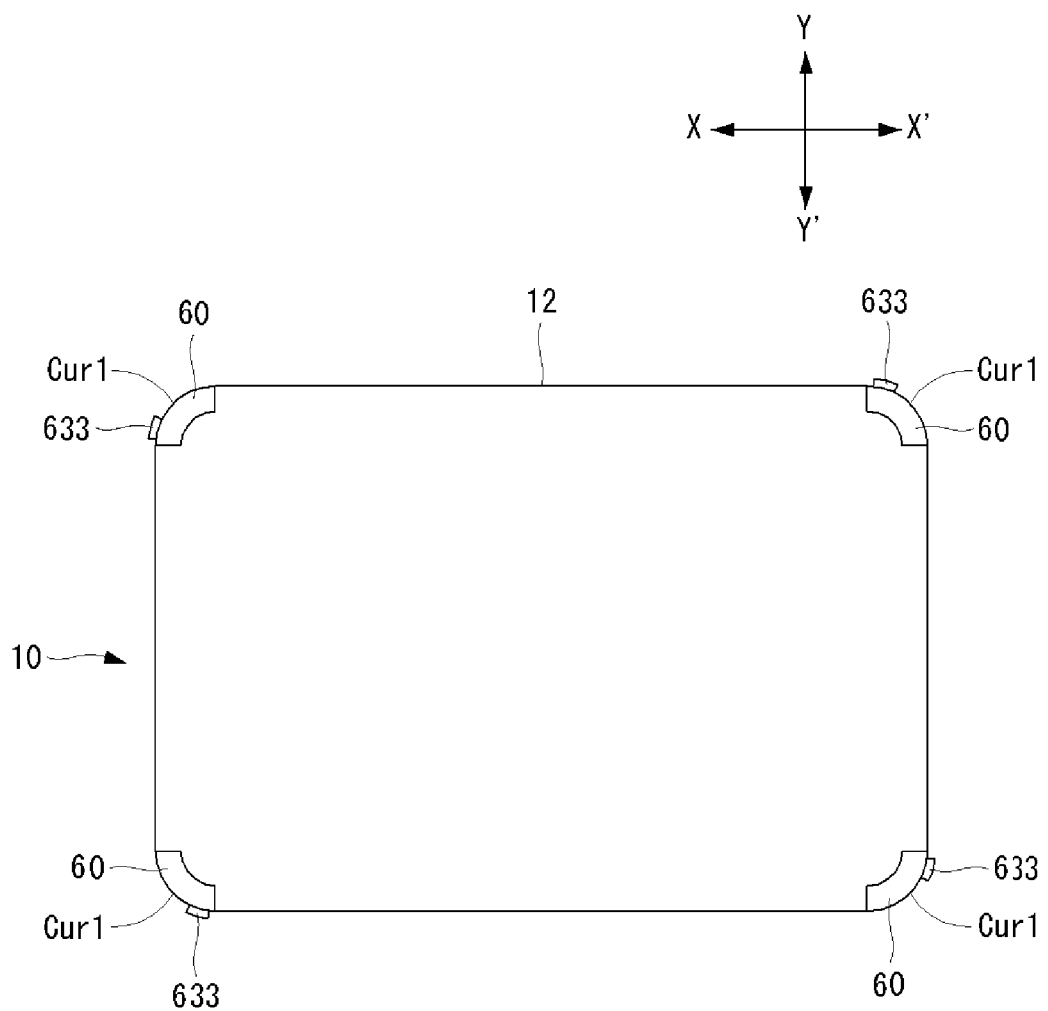
FIG. 13 is a back view of a display device for illustrating an installation state of a lever member.
Figure 14:
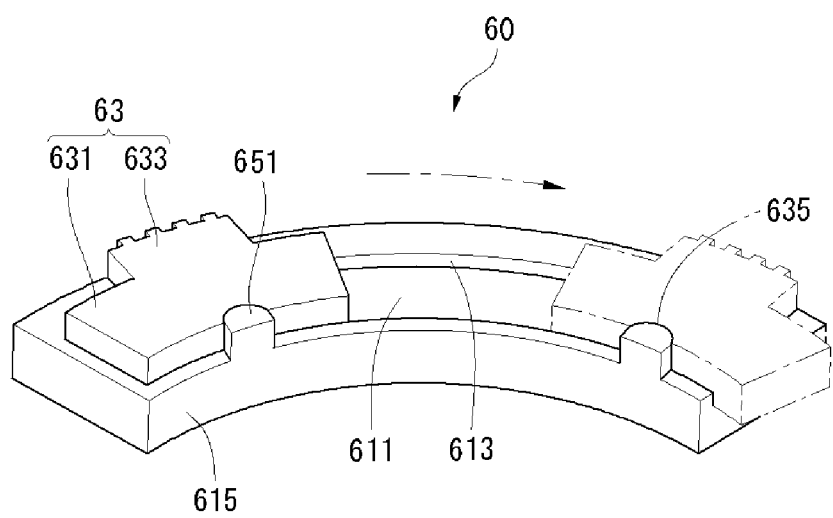
FIG. 14 is a perspective view of a main part of a lever member.

FIG. 13 is a back view of a display device for illustrating an installation state of a lever member. FIG. 14 is a perspective view of a main part of a lever member.

Figure 15A:
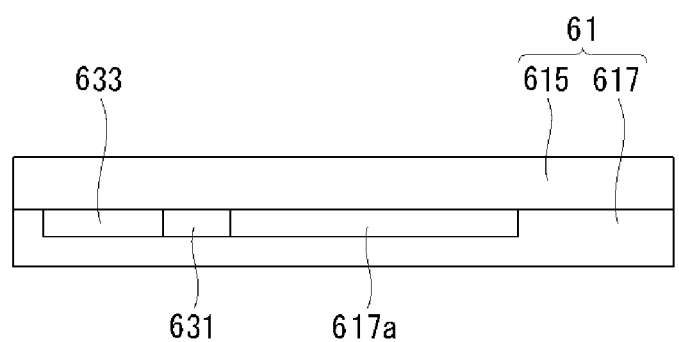
FIGS. 15A and 15B are plane views illustrating a state of a lever member at a sliding start position and a sliding end position of a lever.
Figure 15B:
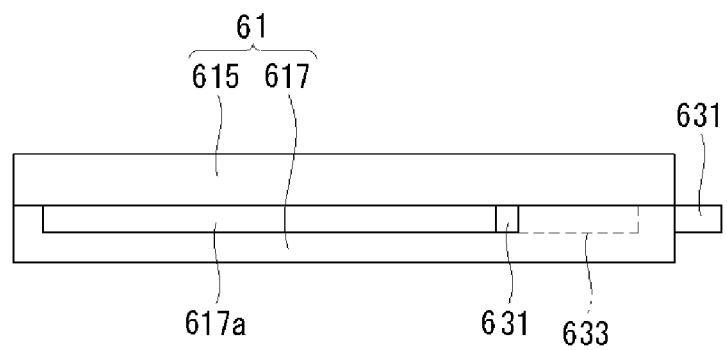
Figure 16:
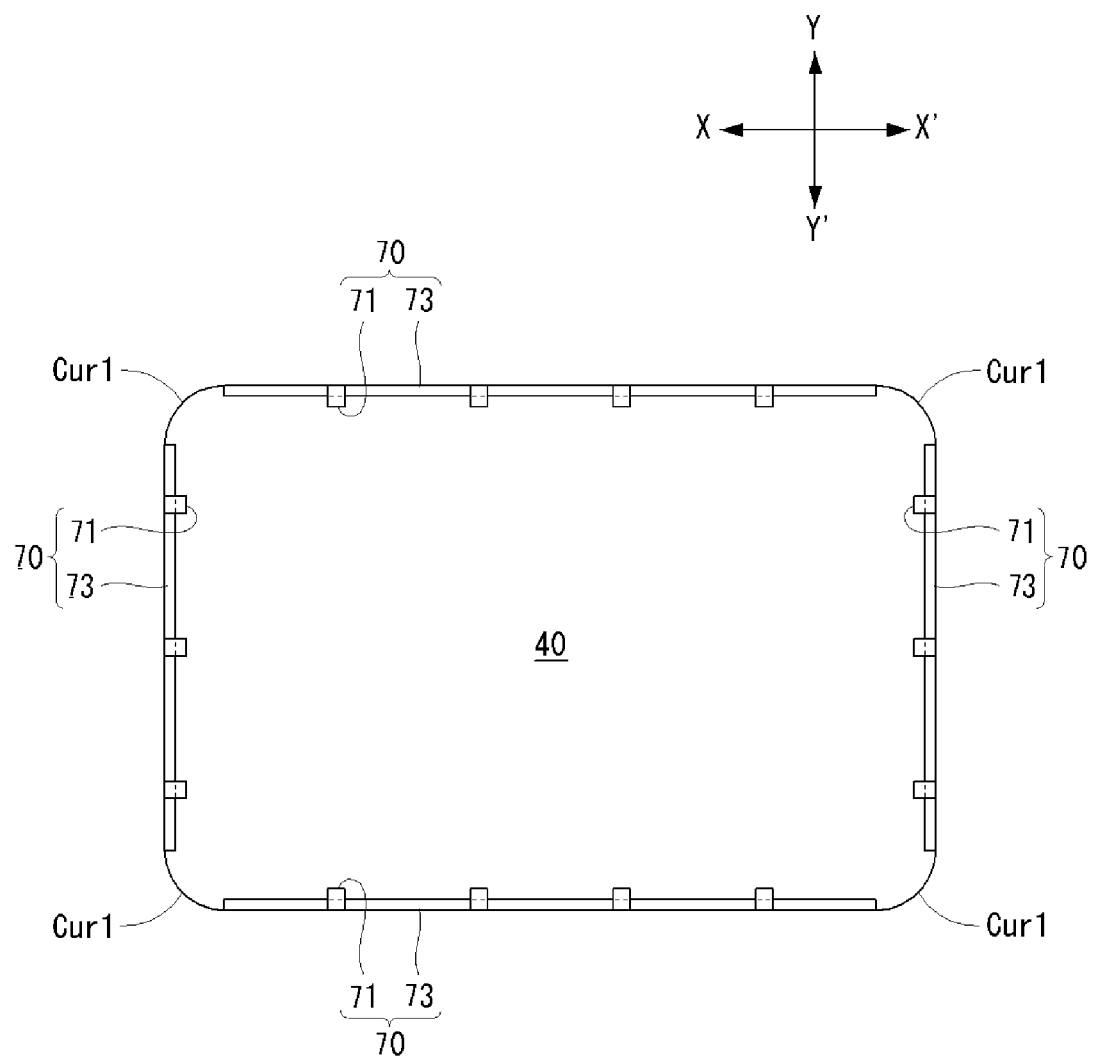
FIG. 16 is a front view of a rear cover for illustrating an installation state of a sliding member.
Figure 17A:
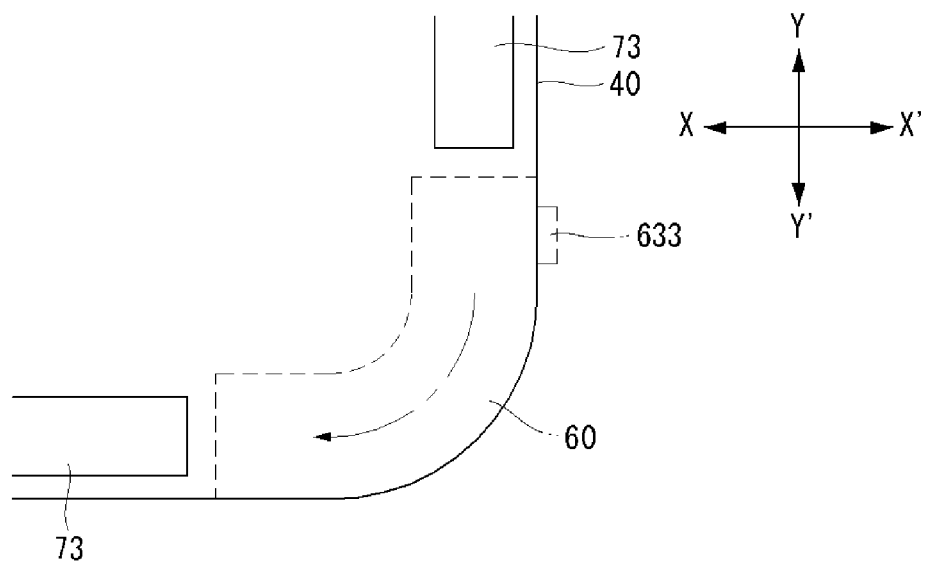
FIGS. 17A and 17B are conceptual diagrams illustrating before and after the assembly of a display device and a rear cover.
Figure 17B:
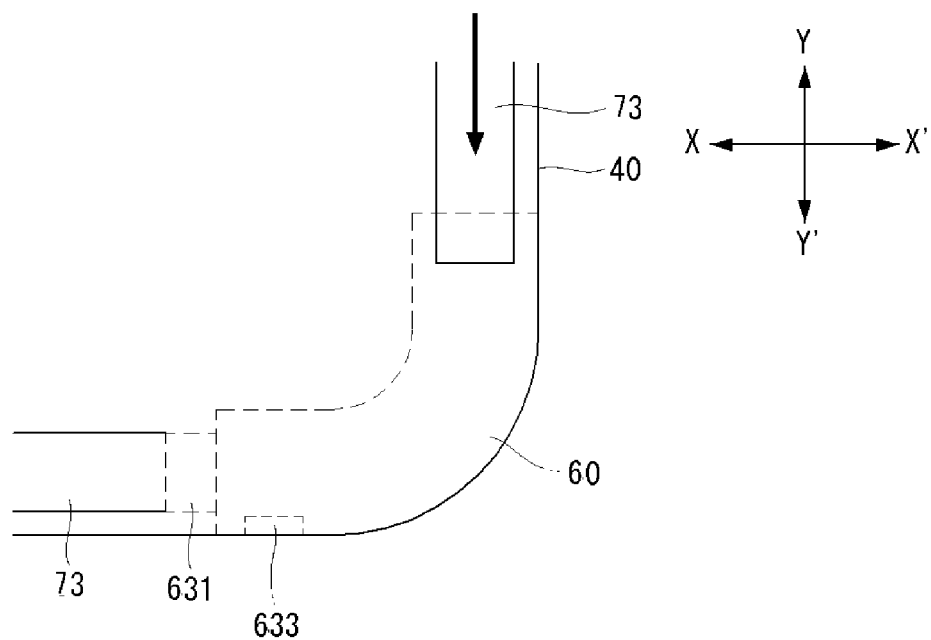

FIGS. 15A and 15B are plane views illustrating a state of the lever member at a sliding start position and a sliding end position of a lever. FIG. 16 is a front view of a rear cover for illustrating an installation state of a sliding member. FIGS. 17A and 17B are conceptual diagrams illustrating before and after the assembly of a display device and a rear cover.

As shown in FIGS. 11 to 17B, a display apparatus 100 according to an embodiment of the invention includes a display device 10 of which edges A, B, C, and D are formed as curved edges Cur1 in the same manner as the display device shown in FIGS. 3 to 8, a middle cabinet 20 and an auxiliary middle cabinet 20a which are coupled with the display device 10 and cover the side of the display device 10, a back cover 30 coupled to a back surface of the display device 10, and a rear cover 40 coupled with the back cover 30.

When the rear cover 40 covers the side of the display device 10, the middle cabinet 20 and the auxiliary middle cabinet 20a may be removed.

Since configuration of the display device 10 according to the second embodiment of the invention is substantially the same as the display device according to the first embodiment of the invention, a further description may be briefly made or may be entirely omitted.

The back cover 30 is attached to the back surface of the display device 10 using an adhesive. A circuit board (not shown) may be disposed on a back surface of the back cover 30.

The back cover 30 may dissipate heat generated in the display device 10.

When the size of the back cover 30 is substantially equal to the size of the display device 10, four edges of the back cover 30 may be formed as curved edges of the same shape as the edges A, B, C, and D of the display device 10. Alternatively, when the size of the back cover 30 is less than the size of the display device 10, the four edges of the back cover 30 may be formed as rectangular edges.

The rear cover 40 may have curved edges of the same shape as the edges A, B, C, and D of the display device 10 in the same manner as the back cover 30.

In the embodiment of the invention, the middle cabinet 20 is attached to the side of the display device 10 and thus covers the side, particularly, the straight side of the display device 10. The middle cabinet 20 may include a bezel 21 covering a periphery area A2 and a pad area A3 of the display device 10 and a side cover 23 covering the side of the display device 10.

The middle cabinet 20 may be attached to the display device 10 using a double-sided tape.

The middle cabinet 20 may cover the four straight sides of the display device 10.

When the middle cabinet 20 covers the four straight sides of the display device 10, the auxiliary middle cabinet 20a may cover the remaining sides, i.e., the four curved edges Cur1 of the display device 10.

The auxiliary middle cabinet 20a may include a bezel and a side cover in the same manner as the middle cabinet 20.

As shown in FIG. 11, the bezel of the auxiliary middle cabinet 20a has an outer edge A' and an inner edge A'', each of which is formed as curved edge Cur1 of the same shape as the edges A, B, C, and D of the display device 10.

As described above, the middle cabinet 20 may be attached to the four straight sides of the display device 10, and the auxiliary middle cabinet 20a may be attached to the four curved edges of the display device 10.

The auxiliary middle cabinet 20a may be attached to the display device 10 using a double-sided tape.

Alternatively, the middle cabinet 20 may be attached to the entire sides (including the straight sides and the curved edges) of the display device 10 without using the auxiliary middle cabinet 20a.

In this instance, the bezel of the middle cabinet 20 may have an outer edge and an inner edge, each of which is formed as curved edge Cur1 of the same shape as the edges A, B, C, and D of the display device 10 in the same manner as the auxiliary middle cabinet 20a.

Although not shown, when the periphery area A2 and the pad area A3 of the display device 10 have a very narrow width, each of the middle cabinet 20 and the auxiliary middle cabinet 20a may not include the bezel.

A lever member 60 is fixed to the back surface of the display device 10 and a sliding member 70 is fixed to a front surface of the rear cover 40, so as to couple a couple structure with the rear cover 40 in a state where the display device 10, the middle cabinet 20, and the back cover 30 are coupled or a state where the display device 10 and the back cover 30 are coupled.

Alternatively, the lever member 60 may be fixed to the front surface of the rear cover 40, and the sliding member 70 may be fixed to the back surface of the display device 10.

Alternatively, the lever member 60 may be fixed to not the back surface of the display device 10 but the back surface of the back cover 30.

In the embodiment of the invention, "the front surface" is the surface facing toward the display device 10, and "the back surface" is the surface opposite the front surface.

As shown in FIGS. 13, 14, 15A, and 15B, the lever member 60 is fixed to the curved edge Cur1 of the back surface of the display device 10.

The lever member 60 includes a housing 61 and a lever 63 which is slidably installed inside the housing 61.

The housing 61 includes a guide block 615 forming a guide rail 613 having a curved part 611 and a cover 617 coupled with the guide block 615.

The lever 63 includes a body 631 coupled with the guide rail 613 and a handle 633 coupled with the body 631.

The cover 617 of the housing 61 includes a hole 617a, to which the handle 633 of the lever 63 protrudes.

According to the above structure of the lever member 60, the lever 63 may slide from a sliding start position indicated by the solid line shown in FIG. 14 to a sliding end position indicated by the dotted line shown in FIG. 14 in an arrow direction shown in FIG. 14 along the curved part 611 of the guide rail 613 in a state where the lever 63 is coupled with the housing 61.

An assembly worker presses the handle 633 protruding to the outside of the housing 61 through the hole 617a in the arrow direction shown in FIG. 14, and thus the sliding operation of the lever 63 may be performed.

As described above, when the handle 633 of the lever 63 is pressed in the arrow direction shown in FIG. 14, the lever 63 slides along the curved part 611 of the guide rail 613 in the arrow direction shown in FIG. 14. When the lever 63 reaches the sliding end position, one end of the lever 63 protrudes to the outside of the housing 61 by a predetermined length.

More specifically, when the lever 63 is positioned at the sliding end position, one end of the lever 63 protrudes to the outside of the housing 61, so as to slide a sliding bar 71 of the sliding member 70. This is described later.

The lever member 60 is configured, so that after the couple structure of the display device 10, the middle cabinet 20, the auxiliary middle cabinet 20a, and the back cover 30 is assembled into the rear cover 40, it is not easy for a user to arbitrarily disassemble the assembly structure.

For this, the curved part 611 of the guide rail 613 has a shape capable of entering the handle 633 of the lever 63 into the housing 61 at the sliding end position of the lever 63.

In other words, as shown in FIG. 15A, when the lever 63 is positioned at the sliding start position, the handle 633 of the lever 63 protrudes to the outside of the housing 61 through the hole 617a. On the other hand, as shown in FIG. 15B, when the lever 63 is positioned at the sliding end position, the handle 633 of the lever 63 is entered into the housing 61.

Accordingly, when the lever 63 is positioned at the sliding end position, the handle 633 of the lever 63 is not exposed to the outside of the housing 61 through the hole 617a.

On the other hand, even when the lever 63 is positioned at the sliding end position, the handle 633 of the lever 63 may protrude to the outside of the housing 61 through the hole 617a.

In this instance, a length of the hole 617a may be longer than the hole 617a shown in FIGS. 15A and 15B, and the curved part 611 of the guide rail 613 may have the same radius of curvature as the curved edge of the display device 10.

The guide block 615 includes a protrusion 651 capable of fixing and sliding the lever 63 at the sliding start position and the sliding end position of the lever 63. The body 631 of the lever 63 has a groove 635, into which the protrusion 651 is inserted.

Accordingly, when the lever 63 slides until the protrusion 651 of the guide block 615 is inserted into the groove 635 of the lever 63, the lever 63 is positioned at the sliding end position.

The sliding member 70 fixed to the front surface of the rear cover 40 is described below with reference to FIG. 16.

As shown in FIG. 16, the sliding member 70 is positioned on the straight sides of the front surface of the rear cover 40. Preferably, the sliding member 70 is disposed at a position almost parallel to the lever member 60 fixed to the back surface of the display device 10.

The sliding member 70 includes guides 71 fixed to the straight sides of the front surface of the rear cover 40 and a sliding bar 73 which is slidably installed on the guides 71.

As shown in FIG. 16, the sliding member 70 having the above-described structure may be formed on the four straight sides of the front surface of the rear cover 40. Alternatively, the sliding member 70 may be formed only on the left and right straight sides of the front surface of the rear cover 40 or only on the upper and lower straight sides of the front surface of the rear cover 40.

However, it is preferable, but not required, that the four sliding members 70 are respectively formed on the four straight sides of the front surface of the rear cover 40 so as to smoothly maintain the assembly state of the display apparatus 100.

FIG. 16 shows that one sliding bar 73 in each of the four sliding members 70 is installed by the plurality of guides 71. However, when the guide 71 has a length almost similar to the sliding bar 73, one sliding bar 73 may be installed using only one guide 71.

A method for assembling the display device and the rear cover is described below with reference to 17A and 17B.

The lever member 60 is fixed to the back surface of the display device 10, and the sliding member 70 is installed on the front surface of the rear cover 40, so as to assemble the display device 10 and the rear cover 40.

More specifically, the lever member 60 is fixed to the curved edge of the back surface of the display device 10, and the sliding member 70 is fixed to the straight side of the front surface of the rear cover 40.

In this instance, the middle cabinet 20 may be coupled with the display device 10, or may not be coupled with the display device 10.

For example, when the middle cabinet 20 is coupled with the straight side of the display device 10, the couple structure and the rear cover 40 may be assembled after the display device 10, the middle cabinet 20, and the back cover 30 are coupled with one another.

In this instance, after the couple structure of the display device 10, the middle cabinet 20, and the back cover 30 is assembled with the rear cover 40, the auxiliary middle cabinet 20a may be coupled with the curved edge of the display device 10.

However, when the middle cabinet 20 is coupled with the four entire sides of the display device 10, the middle cabinet 20 may be coupled with the display device 10 after the couple structure of the display device 10 and the back cover 30 is assembled with the rear cover 40.

As described above, after the display device 10, the middle cabinet 20, and the back cover 30 are coupled, the display device 10 is disposed so that the back surface of the display device 10 faces toward the front surface of the rear cover 40.

As shown in FIG. 17A, when the couple structure thus formed is disposed on the rear cover 40, the lever 63 is positioned at the sliding start position, and the handle 633 of the lever 63 protrudes to the outside of the housing 61 through the hole 617a.

In this state, when the worker presses the handle 633 of the lever 63 in an arrow direction shown in FIG. 17A, the lever 63 starts to slide along the curved part 611 of the guide rail 613 in the arrow direction shown in FIG. 17A.

Afterwards, the worker continuously presses the handle 633 of the lever 63 and slides the lever 63 until the protrusion 651 of the guide block 615 is inserted into the groove 635 of the lever 63. When the protrusion 651 is inserted into the groove 635, the lever 63 is positioned at the sliding end position.

When the lever 63 reaches the sliding end position, the handle 633 of the lever 63 is entered into the housing 61. Further, one end of the lever 63 protrudes to the outside of the housing 61 by a predetermined length.

When one end of the lever 63 starts to protrude to the outside of the housing 61, the sliding bar 73 start to slide inside the guide 71 from a time point at which one end of the lever 63 contacts the sliding bar 73.

Afterwards, as the sliding bar 73 slides, one end of the sliding bar 73 starts to be entered into the housing 61. When the lever 63 is positioned at the sliding end position, a portion of one end of the sliding bar 73 is completely entered into the housing 61.

Accordingly, as described above, the sliding member 70 is fixed to the rear cover 40, and the lever member 60 is fixed to display element 10. When the sliding bar 73 is entered into in the housing 61, the couple structure of the display device 10, the middle cabinet 20, and the back cover 30 is assembled with the rear cover 40.

Afterwards, the auxiliary middle cabinet 20a is coupled with the portion (i.e., the curved edge) of the display device 10, to which the lever member 60 is fixed. Hence, the assembly of the display apparatus 100 is completed.

The above-described assembly structure, in which the sliding bar 73 slides inside the guide 71 by the sliding of the lever 63 along the curved part 611 may be used because the edges of the display device 10 are formed as the curved edges Cur1 and the edges of the rear cover 40 are formed as the curved edges having the same shape and the same radius of curvature as the curved edges Cur1 of the display device 10.

In other words, when the edges of the display device are formed as not the curved edges but the straight edges, a distance between the lever member and the edges of the display device greatly increases even if the guide rail for guiding the sliding of the lever of the lever member is formed as the curved part. Hence, it is not easy to press the lever member from the outside of the display device.

Accordingly, the above-described assembly structure, in which the sliding bar 73 slides inside the guide 71 by the sliding of the lever 63 along the curved part 611 may be applied to the embodiment of the invention, in which the edges of the display device are formed as the curved edges.

The display apparatus 100 assembled by the above-described coupling structure using the lever member 60 and the sliding member 70 may use a unibody structure.

So far, the embodiment of the invention described the display apparatus 100 including the flat panel type display device 10.

Figure 18:
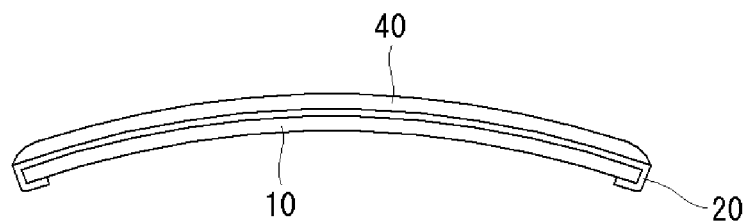
FIG. 18 is a plane view of a display apparatus according to a third embodiment of the invention.

However, as shown in FIG. 18, the display apparatus according to the embodiment of the invention may include a display device which is bent in a curved shape. In this instance, both the first and second substrates of the display device 10 may be flexible substrates.

The first and second substrates 11 and 12 of the display device 10 may have the same size. In this instance, the second substrate 12 does not have a pad area.

The display device 10 may have polygon edges having 'n' or more apexes, where n is a natural number equal to or greater than 2. In other words, the polygon edges of the display device 10 have at least two apexes and at least one straight side between the adjacent apexes.

In this instance, as the number 'n' of apexes increases, the edges of the display device 10 may have a circle shape or an oval shape.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus comprising:
    a display device including a plurality of edges formed as curved edges and straight sides connecting the curved edges;
    a back cover coupled to a back surface of the display device;
    a rear cover coupled with the display device and the back cover, the rear cover having four edges formed as curved edges of the same shape as the curved edges of the display device;
    a lever member including a housing fixed to the back surface of the display device or a back surface of the back cover and a lever slidably installed inside the housing; and
    a sliding member including a guide positioned on a front surface of the rear cover and a sliding bar which is slidably installed on the guide, contacts the lever when the lever slides, and is used in position movement.

2. The display apparatus of claim 1, wherein the housing is positioned at the curved edges of the display device, and the guide and the sliding bar are positioned on the front surface of the rear cover opposite the straight sides of the display device.

3. The display apparatus of claim 2, wherein the housing includes a guide block forming a guide rail having a curved part and a cover coupled with the guide block,
    wherein the lever of the lever member is coupled with the guide rail.

4. The display apparatus of claim 3, wherein the lever includes a body coupled with the guide rail and a handle coupled with the body.

5. The display apparatus of claim 4, wherein the cover of the housing has a hole, to which the handle of the lever protrudes.

6. The display apparatus of claim 5, wherein the handle protrudes to the outside of the housing through the hole at a sliding start position of the lever,
    wherein the handle is entered into the housing and does not protrude to the outside of the housing through the hole at a sliding end position of the lever.

7. The display apparatus of claim 6, wherein the guide block includes a protrusion capable of fixing and sliding the lever at the sliding start position and the sliding end position of the lever,
    wherein the lever includes a groove, into which the protrusion is inserted.

8. The display apparatus of claim 6, wherein the sliding bar slides along the guide by a sliding operation of the lever, and one end of the sliding bar is coupled with the housing when the lever is positioned at the sliding end position.

9. The display apparatus of claim 8, further comprising a middle cabinet covering a side of the display device, the middle cabinet covering the straight sides of the display device.

10. The display apparatus of claim 9, further comprising an auxiliary middle cabinet covering the curved edges of the display device, the auxiliary middle cabinet covering the curved edges of the display device in a state where the lever is positioned at the sliding end position.

11. The display apparatus of claim 1, wherein the display device includes:
    a first substrate;
    a second substrate positioned opposite the first substrate;
    a seal member configured to attach the first substrate to the second substrate and seal a display area positioned on the first substrate or the second substrate; and
    a plurality of pixels positioned in the display area, each of the plurality of pixels including an organic light emitting layer,
    wherein each of the first substrate and the second substrate includes two first straight sides extending in a first direction, two second straight sides extending in a second direction crossing the first direction, and four edges where the two first straight sides and the two second straight sides intersect, wherein the four edges of each of the first substrate and the second substrate form the curved edges of the display device.

12. The display apparatus of claim 11, wherein the display area includes a first pixel unit including m pixels arranged in the first direction and n pixels arranged in the second direction, where 'm' and 'n' are a positive integer equal to or greater than 3, and a second pixel unit including pixels, of which the number is less than 'm', arranged in the first direction and pixels, of which the number is less than 'n', arranged in the second direction.

13. The display apparatus of claim 12, wherein a radius of curvature of a circle forming the curved edges of the first and second substrates is about 5 mm to 35 mm.

* * * * *